US 010111366B2

(12) United States Patent
Fan et al.

(10) Patent No.: US 10,111,366 B2
(45) Date of Patent: Oct. 23, 2018

(54) COOLING SYSTEM AND SERVER

(71) Applicants: Beijing Lenovo Software Ltd., Beijing (CN); Lenovo (Beijing) Co., Ltd., Beijing (CN)

(72) Inventors: Jui-Chan Fan, Beijing (CN); Jeng-Ming Lai, Beijing (CN)

(73) Assignees: Beijing Lenovo Software Ltd., Beijing (CN); Lenovo (Beijing) Co., Ltd., Beijing (CN)

( * ) Notice: Subject to any disclaimer, the term of this patent is extended or adjusted under 35 U.S.C. 154(b) by 255 days.

(21) Appl. No.: 14/859,770

(22) Filed: Sep. 21, 2015

(65) Prior Publication Data

US 2016/0374234 A1    Dec. 22, 2016

(30) Foreign Application Priority Data

Jun. 16, 2015   (CN) .......................... 2015 1 0333875

(51) Int. Cl.
*H05K 7/20*          (2006.01)

(52) U.S. Cl.
CPC ..... *H05K 7/20818* (2013.01); *H05K 7/20336* (2013.01); *H05K 7/20436* (2013.01); *H05K 7/20736* (2013.01)

(58) Field of Classification Search
CPC ... H01L 23/427; H01L 23/467; H01L 23/473; F28D 15/0266; F28D 15/0275; F28D 2015/0291

(Continued)

(56) References Cited

U.S. PATENT DOCUMENTS 4,073,338 A * 2/1978 Fujikake et al. ........ F28D 11/02
                                                   165/86
4,293,030 A * 10/1981 Rambach ................ F25B 23/00
                                                   165/104.32

(Continued)

FOREIGN PATENT DOCUMENTS

CN          2422675 Y       3/2001
CN          1529360 A       9/2004

(Continued)

OTHER PUBLICATIONS

Office Action regarding Chinese Patent Application No. 201510333875.8, dated Jan. 29, 2018. Translation provided by Unitalen Attorneys at Law.

*Primary Examiner* — Allen Flanigan
(74) *Attorney, Agent, or Firm* — Harness, Dickey & Pierce, P.L.C.

(57) ABSTRACT

A cooling system includes a first heat exchanging component configured to connect to a heat source and obtain heat of the heat source by heat transfer, to dissipate heat of the heat source; and a first pipe configured to connect to the first heat exchanging component and a second heat exchanging component and form a loop between the first and second heat exchanging components, and to transfer the heat obtained by the first heat exchanging component to the second heat exchanging component via the loop. A first position relationship is provided between the first heat exchanging component and the second heat exchanging component, to allow a cooling liquid in the first pipe to automatically flow into the second heat exchanging component after the cooling liquid exchanges heat with the first heat exchanging component, to transfer the heat generated by the heat source to the second heat exchanging component.

5 Claims, 2 Drawing Sheets

(58) Field of Classification Search
USPC ........ 165/80.4, 85, 104.13, 104.14, 104, 33; 361/699, 700
See application file for complete search history.

(56) References Cited

U.S. PATENT DOCUMENTS

| | | | | | |
|---|---|---|---|---|---|
| 4,299,275 | A * | 11/1981 | Robinson, Jr. | ........ | F24D 11/003 126/636 |
| 6,208,512 | B1 * | 3/2001 | Goldowsky et al. | ..... | F04D 3/02 165/104.33 |
| 6,327,145 | B1 * | 12/2001 | Lian et al. | ............ | H01L 23/473 165/80.4 |
| 6,600,649 | B1 * | 7/2003 | Tsai et al. | ............. | H01L 23/473 165/104.33 |
| 6,832,646 | B1 * | 12/2004 | Uomori et al. | ......... | G06F 1/203 165/80.2 |
| 7,233,492 | B2 * | 6/2007 | Staben et al. | ...... | H05K 7/20727 165/80.4 |
| 7,352,577 | B2 * | 4/2008 | Chen et al. | ............. | F28D 7/026 165/104.21 |
| 7,438,120 | B2 * | 10/2008 | Hong et al. | ........... | H01L 23/427 165/104.26 |
| 7,481,263 | B2 * | 1/2009 | Breier et al. | .......... | F28F 13/125 165/104.21 |
| 8,347,951 | B2 * | 1/2013 | Zhou et al. | ......... | F28D 15/0233 165/80.2 |
| 2006/0007656 | A1 * | 1/2006 | Symons | ................ | H01L 23/473 361/699 |
| 2007/0246196 | A1 * | 10/2007 | Bhatti et al. | ............. | F28D 15/02 165/104.33 |

FOREIGN PATENT DOCUMENTS

| | | |
|---|---|---|
| CN | 1549079 A | 11/2004 |
| CN | 101424965 A | 5/2009 |
| CN | 201663784 U | 12/2010 |
| JP | 200166080 A | 3/2001 |

* cited by examiner

COOLING SYSTEM AND SERVER

CROSS-REFERENCE TO RELATED APPLICATIONS

This application claims the benefit of priority to Chinese Patent Application No. 201510333875.8 titled "COOLING SYSTEM AND SERVER", filed with the Chinese State Intellectual Property Office on Jun. 16, 2015, the entire disclosure of which is incorporated herein by reference.

TECHNICAL FIELD

The present application relates to heat dissipation techniques, and particularly to a cooling system and a server.

BACKGROUND

Heat dissipation methods mainly used in a conventional server are divided into an air-cooling method and a water-cooling method according to the cooling media. In the air-cooling method, a fan rotates to generate air current to bring away heat in a server, however the fan needs to consume electric energy, and for bringing away a large amount of heat, the fan usually rotates at a high speed, which generates a large noise and causes a poor heat dissipation effect. In the water-cooling method, many additional elements, such as a water pump, are generally required to be provided, which may increase the energy consumption. Therefore, there is an urgent need to provide a new-type cooling system to address the above issues and improve the heat dissipation efficiency.

SUMMARY

A cooling system and a server are provided according to embodiments of the present application.

The technical solutions according to the embodiments of the present application are implemented in the following ways.

A cooling system is provided according to embodiments of the present application, which includes a first heat exchanging component and a first pipe. The first heat exchanging component is configured to connect to a heat source and obtain heat of the heat source by heat transfer, to dissipate heat of the heat source. The first pipe is configured to connect to the first heat exchanging component and a second heat exchanging component, and form a loop between the first heat exchanging component and the second heat exchanging component, and to transfer the heat obtained by the first heat exchanging component to the second heat exchanging component via the loop formed by the first pipe. A first position relationship is provided between the first heat exchanging component and the second heat exchanging component, to allow a cooling liquid in the first pipe to automatically flow into the second heat exchanging component after the cooling liquid exchanges heat with the first heat exchanging component, to transfer the heat generated by the heat source to the second heat exchanging component. The heat source is a central processing unit in a server.

A server is further provided according to embodiments of the present application, which includes a first heat exchanging component and a first pipe. The first heat exchanging component is configured to connect to a heat source and obtain heat of the heat source by heat transfer, to dissipate heat of the heat source. The first pipe is configured to connect to the first heat exchanging component and a second heat exchanging component, and form a loop between the first heat exchanging component and the second heat exchanging component, and to transfer the heat obtained by the first heat exchanging component to the second heat exchanging component via the loop formed by the first pipe. A first position relationship is provided between the first heat exchanging component and the second heat exchanging component, to allow a cooling liquid in the first pipe to automatically flow into the second heat exchanging component after the cooling liquid exchanges heat with the first heat exchanging component, to transfer the heat generated by the heat source to the second heat exchanging component.

DETAILED DESCRIPTION

For more completely understanding the characteristics and technical solutions of the present application, the implementations of the present application are described in details in conjunction with drawings, and the drawings are only for reference and description and should not be interpreted as a limitation to the present application.

First Embodiment

Figure 1:
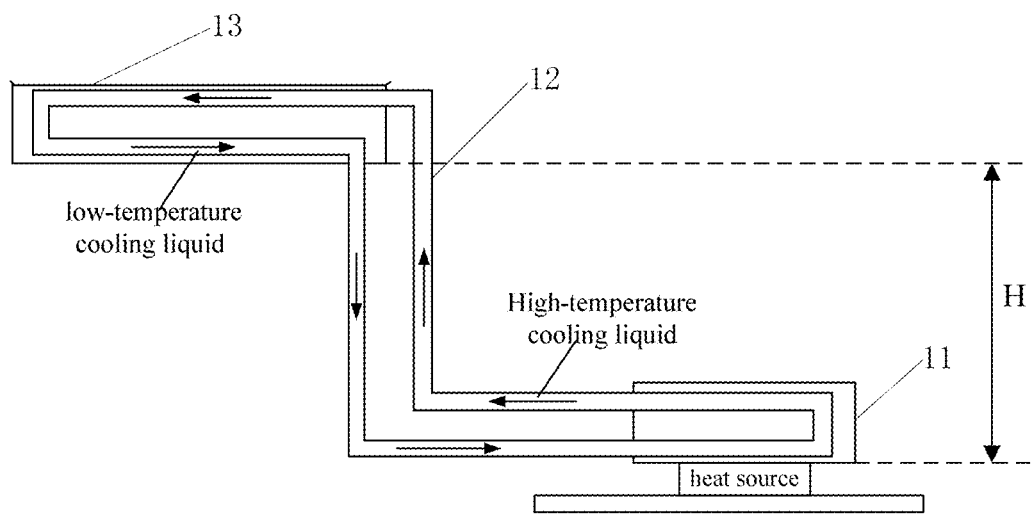
FIG. 1 is a schematic view showing the structure of a cooling system according to a first embodiment of present application.

FIG. 1 is a schematic view showing the structure of a cooling system according to the first embodiment of present application. As shown in FIG. 1, the cooling system includes a first heat exchanging component 11 and a first pipe 12. The first heat exchanging pipe 11 is configured to connect to a heat source and obtain heat of the heat source by heat transfer, to dissipate heat of the heat source. The first pipe 12 is configured to connect to the first heat exchanging component 11 and a second heat exchanging component 13, and form a loop between the first heat exchanging component 11 and the second heat exchanging component 13. The loop formed by the first pipe 12 is configured to transfer the heat obtained by the first heat exchanging component 11 to the second heat exchanging component 13. The first heat exchanging component 11 and the second heat exchanging component 13 have a first position relationship, to allow a cooling liquid in the first pipe 12 to automatically flow into the second heat exchanging component 13 after the cooling liquid exchanges heat with the first heat exchanging component 11, to transfer the heat generated by the heat source to the second heat exchanging component 13.

As shown in FIG. 1, in this embodiment, the first heat exchanging component 11 and the second heat exchanging component 13 have a first position relationship, in which the second heat exchanging component 13 is higher than the first heat exchanging component 11, thus a height difference H is formed between the first heat exchanging component 11 and the second heat exchanging component 13.

In actual applications, the height difference H may be set according to empirical values.

In this embodiment, the first heat exchanging component 11 and the second heat exchanging component 13 may be embodied as heat exchangers. The cooling liquid in the first pipe 12 may be water or a coolant, and other fluids. The circulation way of the cooling liquid in the first pipe 12 is indicated by arrows in FIG. 1. Specifically, a low-temperature cooling liquid flows out of the second heat exchanging component 13 through the first pipe 12, and flows into the first heat exchanging component 11 while passing through a heat source corresponding to the first heat exchanging component 11. When the low-temperature cooling liquid passes through the heat source, the cooling liquid absorbs the heat of the heat source by heat transfer and with the assistance of the first heat exchanging component 11, that is, the low-temperature cooling liquid obtains the heat of the heat source by heat transfer with the heat source and with the assistance of the first heat exchanging component 11, and further, the temperature of the cooling liquid is increased, thereby obtaining a high-temperature cooling liquid. Herein, since the low-temperature cooling liquid is heated by heat exchange, the temperature thereof is increased and bubbles are generated, and the rising of the bubbles can generate a power for circulation, the power for circulation pushes the high-temperature cooling liquid to flow to the second heat exchanging component 13 at a higher position, thus the object of transferring the heat of the heat source to the second heat exchanging component 13 is realized, and further the temperature of the heat source is reduced. That is, the low-temperature cooling liquid flows out of the second heat exchanging component 13 through the first pipe 12 and further flows into the first heat exchanging component 11, and after the low-temperature cooling liquid passes through the heat source corresponding to the first heat exchanging component 11, the temperature thereof is increased, thus the low-temperature cooling liquid becomes a high-temperature cooling liquid, and the high-temperature cooling liquid employs the power for circulation generated by the rising of the bubbles to push itself to flow into the second heat exchanging component 13. The above process is repeated to realize heat dissipation of the heat source.

In a specific embodiment, the heat source may be embodied as a main heat generating unit in a server, for example a central processing unit CPU.

In this way, since the cooling liquid generates bubbles after the temperature of the cooling liquid is increased, and the rising of the bubbles can generate the power for circulation, the power for circulation is used to drive the cooling liquid in the first pipe to circularly flow, and further dissipate heat of the heat source. Therefore, compared with the conventional way of using the power generated by a water pump as the power for circulation, the embodiments of the present application can save power consumption and reduce the cost of the cooling system.

Second Embodiment

Figure 2:
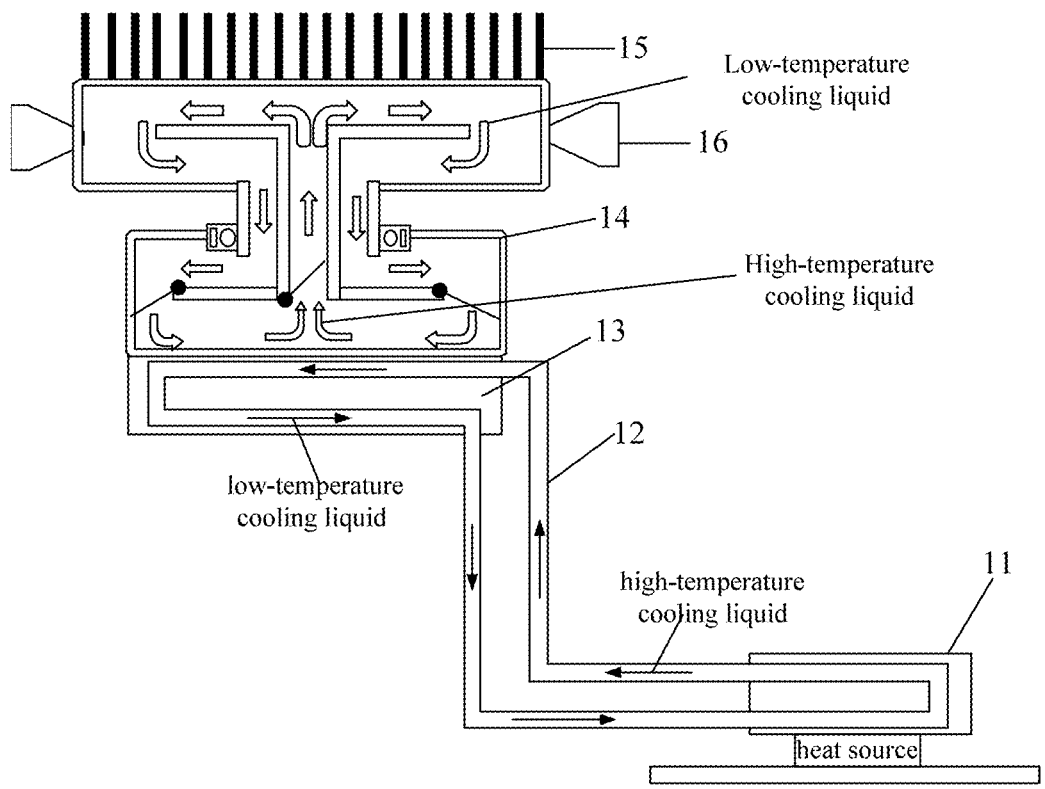
FIG. 2 is a schematic view showing the structure of a cooling system according to a second embodiment of present application.

FIG. 2 is a schematic view showing the structure of a cooling system according to the second embodiment of present application. As shown in FIG. 2, the cooling system includes a first heat exchanging component 11 and a first pipe 12. The first heat exchanging pipe 11 is configured to connect to a heat source and obtain heat of the heat source by heat transfer, to dissipate heat of the heat source. The first pipe 12 is configured to connect to the first heat exchanging component 11 and a second heat exchanging component 13, and form a loop between the first heat exchanging component 11 and the second heat exchanging component 13. The loop formed by the first pipe 12 is configured to transfer the heat obtained by the first heat exchanging component 11 to the second heat exchanging component 13. The first heat exchanging component 11 and the second heat exchanging component 13 have a first position relationship, to allow a cooling liquid in the first pipe 12 to automatically flow into the second heat exchanging component 13 after the cooling liquid exchanges heat with the first heat exchanging component 11, to transfer the heat generated by the heat source to the second heat exchanging component 13.

The cooling system further includes a second pipe 14. A loop is formed by the second pipe 14 to allow the cooling liquid to circulate in the loop formed by the second pipe 14. A first partial area of the second pipe 14 corresponds to the second heat exchanging component, to transfer heat conducted to the second heat exchanging component 13 to a cooling liquid corresponding to the first partial area of the second pipe 14. A first heat dissipation component 15 is provided in a second partial area of the second pipe 14, and configured to transfer the heat transferred to the second pipe 14 to the environment outside the cooling system.

In this embodiment, the process of transferring the heat transferred to the second pipe 14 to the environment outside the cooling system via the first heat dissipation component 15 may be realized in the following way. The heat transferred to the first partial area is transferred to the first heat dissipation component 15 by circulation of the cooling liquid, to further transfer the heat to the environment outside the cooling system via the first heat dissipation component 15.

In a specific embodiment, the first heat dissipation component is embodied as a heat dissipation component with rotatable fins.

As shown in FIG. 1, in this embodiment, the first heat exchanging component 11 and the second heat exchanging component 13 have a first position relationship, in which the second heat exchanging component 13 is higher than the first heat exchanging component 11, thus a height difference H is formed between the first heat exchanging component 11 and the second heat exchanging component 13.

In actual applications, the height difference H may be set according to empirical values.

In this embodiment, the first heat exchanging component 11 and the second heat exchanging component 13 may be embodied as heat exchangers. The cooling liquid in the first pipe 12 may be water or a coolant, and other fluids. The circulation way of the cooling liquid in the first pipe 12 is indicated by arrows in FIG. 1. Specifically, a low-temperature cooling liquid flows out of the second heat exchanging component 13 through the first pipe 12, and flows into the first heat exchanging component 11 while passing through a heat source corresponding to the first heat exchanging component 11. When the low-temperature cooling liquid passes through the heat source, the cooling liquid absorbs the heat of the heat source by heat transfer and with the assistance of the first heat exchanging component 11, that is, the low-temperature cooling liquid obtains the heat of the heat source by heat transfer with the heat source and with the assistance of the first heat exchanging component 11, and further, the temperature of the cooling liquid is increased, thereby obtaining a high-temperature cooling liquid. Herein, since the low-temperature cooling liquid is heated by heat exchange, the temperature thereof is increased and bubbles are generated, and the rising of the bubbles can generate a power for circulation, the power for circulation pushes the high-temperature cooling liquid to flow to the second heat exchanging component 13 at a higher position, thus the object of transferring the heat of the heat source to the second heat exchanging component 13 is realized, and further the temperature of the heat source is reduced. That is, the low-temperature cooling liquid flows out of the second heat exchanging component 13 through the first pipe 12 and further flows into the first heat exchanging component 11, and after the low-temperature cooling liquid passes through the heat source corresponding to the first heat exchanging component 11, the temperature thereof is increased, thus the low-temperature cooling liquid becomes a high-temperature cooling liquid, and the high-temperature cooling liquid employs the power for circulation generated by the rising of the bubbles to push itself to flow into the second heat exchanging component 13. The above process is repeated to realize heat dissipation of the heat source.

In a specific embodiment, the heat source may be embodied as a main heat generating unit in a server, for example a central processing unit CPU.

Figure 3:
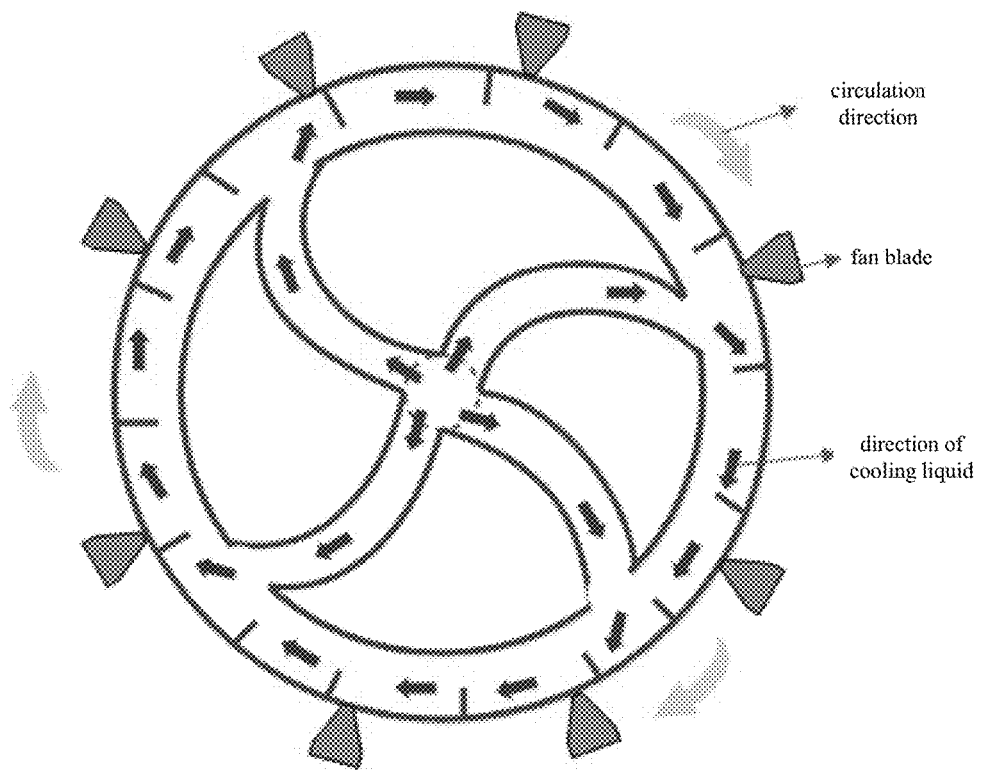
FIG. 3 is a schematic view showing the circulation way of the cooling liquid in a second pipe 14 according to the second embodiment of the present application.

FIG. 3 is a schematic view showing the circulation way of the cooling liquid in the second pipe 14 according to the second embodiment of the present application. As shown in FIG. 3, the circulation way of the cooling liquid in the second pipe 14 is indicated by arrows in FIGS. 2 and 3, the second pipe 14 brings away heat in the second heat exchanging component 13 and partial areas of the first pipe 12 by a heat exchange, and meanwhile the heat is transferred to the environment outside the cooling system via the first heat dissipation component 15 according to the circulation way of the cooling liquid in FIGS. 2 and 3, which further enables the second pipe 14 to assist the cooling system in heat dissipation.

In a specific embodiment, as shown in FIG. 2, a fan blade 16 is provided in the second pipe 14, and can assist the cooling system in heat dissipation.

Similar to the way of automatic circulation in the first pipe 12, the first partial area of the second pipe 14 corresponds to the second heat exchanging component 13, and parallelly corresponds to a partial area, connected to the second heat exchanging component 13, of the first pipe 12. In this way, after the cooling liquid in the second pipe 14 passes through the second heat exchanging component 13 and the first pipe 12 parallelly corresponding to the first partial area of the second pipe 14, the temperature of the cooling liquid is increased, and the cooling liquid becomes the high-temperature cooling liquid. The high-temperature cooling liquid uses the power for circulation generated by the rising of the bubbles to push itself to circulate in the circulation way of the cooling liquid in the second pipe 14 as shown in FIGS. 2 and 3, and transfers the heat to the first heat dissipation component 15, and then the heat is released into the environment outside the cooling system via the first heat dissipation component 15, thereby assisting the first heat exchanging component 11 and the second heat exchanging component 13 in dissipating heat of the heat source.

In this way, since the cooling liquid generates bubbles after the temperature of the cooling liquid is increased, and the rising of the bubbles can generate the power for circulation, the power for circulation is used to drive the cooling liquid in the first pipe to circularly flow, and further dissipate heat of the heat source. Therefore, compared with the conventional way of using the power generated by a water pump as the power for circulation, the embodiments of the present application can save power consumption and reduce the cost of the cooling system.

In addition, the source of the power for circulation of the cooling liquid in the second pipe is similar to that of the cooling liquid in the first pipe, and the sources are both coming from the power generated by the rising of the bubbles which are generated by the cooling liquid with the temperature being increased. Therefore, additional devices, such as a water pump, is not required to be provided in the second pipe, which further saves the power consumption and reduces the cost of the cooling system.

Third Embodiment

Referring to the structure of the cooling system shown in FIG. 2, a cooling system is further provided according to an embodiment of the present application, which includes a first heat exchanging component 11 and a first pipe 12. The first heat exchanging pipe 11 is configured to connect to a heat source and obtain heat of the heat source by heat transfer, to dissipate heat of the heat source. The first pipe 12 is configured to connect to the first heat exchanging component 11 and a second heat exchanging component 13, and form a loop between the first heat exchanging component 11 and the second heat exchanging component 13. The loop formed by the first pipe 12 is configured to transfer the heat obtained by the first heat exchanging component 11 to the second heat exchanging component 13. The first heat exchanging component 11 and the second heat exchanging component 13 have a first position relationship, to allow a cooling liquid in the first pipe 12 to automatically flow into the second heat exchanging component 13 after the cooling liquid exchanges heat with the first heat exchanging component 11, to transfer the heat generated by the heat source to the second heat exchanging component 13.

The cooling system further includes a second pipe 14. A loop is formed by the second pipe 14 to allow the cooling liquid to circulate in the loop formed by the second pipe 14. A first partial area of the second pipe 14 corresponds to the second heat exchanging component, to transfer heat conducted to the second heat exchanging component 13 to a cooling liquid corresponding to the first partial area of the second pipe 14. A first heat dissipation component 15 is provided in a second partial area of the second pipe 14, and configured to transfer the heat transferred to the second pipe 14 to the environment outside the cooling system.

In this embodiment, the process of transferring the heat transferred to the second pipe 14 to the environment outside the cooling system via the first heat dissipation component 15 may be realized in the following way. The heat transferred to the first partial area is transferred to the first heat dissipation component 15 by circulation of the cooling liquid, to further transfer the heat to the environment outside the cooling system via the first heat dissipation component 15.

In a specific embodiment, the first heat dissipation component is embodied as a heat dissipation component with rotatable fins.

As shown in FIG. 1, in this embodiment, the first heat exchanging component 11 and the second heat exchanging component 13 have a first position relationship, in which the second heat exchanging component 13 is higher than the first heat exchanging component 11, thus a height difference H is formed between the first heat exchanging component 11 and the second heat exchanging component 13.

In actual applications, the height difference H may be set according to empirical values.

The cooling system further includes a second heat dissipation component. The second heat dissipation component is configured to assist in dissipating heat of the environment corresponding to the heat source.

In this embodiment, the first heat exchanging component 11 and the second heat exchanging component 13 may be embodied as heat exchangers. The cooling liquid in the first pipe 12 may be water or a coolant, and other fluids. The circulation way of the cooling liquid in the first pipe 12 is indicated by arrows in FIG. 1. Specifically, a low-temperature cooling liquid flows out of the second heat exchanging component 13 through the first pipe 12, and flows into the first heat exchanging component 11 while passing through a heat source corresponding to the first heat exchanging component 11. When the low-temperature cooling liquid passes through the heat source, the cooling liquid absorbs the heat of the heat source by heat transfer and with the assistance of the first heat exchanging component 11, that is, the low-temperature cooling liquid obtains the heat of the heat source by heat transfer with the heat source and with the assistance of the first heat exchanging component 11, and further, the temperature of the cooling liquid is increased, thereby obtaining a high-temperature cooling liquid. Herein, since the low-temperature cooling liquid is heated by heat exchange, the temperature thereof is increased and bubbles are generated, and the rising of the bubbles can generate a power for circulation, the power for circulation pushes the high-temperature cooling liquid to flow to the second heat exchanging component 13 at a higher position, thus the object of transferring the heat of the heat source to the second heat exchanging component 13 is realized, and further the temperature of the heat source is reduced. That is, the low-temperature cooling liquid flows out of the second heat exchanging component 13 through the first pipe 12 and further flows into the first heat exchanging component 11, and after the low-temperature cooling liquid passes through the heat source corresponding to the first heat exchanging component 11, the temperature thereof is increased, thus the low-temperature cooling liquid becomes a high-temperature cooling liquid, and the high-temperature cooling liquid employs the power for circulation generated by the rising of the bubbles to push itself to flow into the second heat exchanging component 13. The above process is repeated to realize heat dissipation of the heat source.

As shown in FIGS. 2 and 3, the circulation way of the cooling liquid in the second pipe 14 is indicated by arrows in FIGS. 2 and 3, the second pipe 14 brings away heat in the second heat exchanging component 13 and partial areas of the first pipe 12 by heat exchange, and meanwhile the heat is transferred to the environment outside the cooling system via the first heat dissipation component 15 according to the circulation way of the cooling liquid in FIGS. 2 and 3, which further enables the second pipe 14 to assist the cooling system in heat dissipation.

Similar to the way of automatic circulation in the first pipe 12, the first partial area of the second pipe 14 corresponds to the second heat exchanging component 13, and parallelly corresponds to a partial area, connected to the second heat exchanging component 13, of the first pipe 12. In this way, after the cooling liquid in the second pipe 14 passes through the second heat exchanging component 13 and the first pipe 12 parallelly corresponding to the first partial area of the second pipe 14, the temperature of the cooling liquid is increased, and the cooling liquid becomes the high-temperature cooling liquid. The high-temperature cooling liquid uses the power for circulation generated by the rising of the bubbles to push itself to circulate in the circulation way of the cooling liquid in the second pipe 14 as shown in FIGS. 2 and 3, and transfers the heat to the first heat dissipation component 15, and then the heat is released into the environment outside the cooling system via the first heat dissipation component 15, thereby assisting the first heat exchanging component 11 and the second heat exchanging component 13 in dissipating heat of the heat source.

In this way, since the cooling liquid generates bubbles after the temperature of the cooling liquid is increased, and the rising of the bubbles can generate the power for circulation, the power for circulation is used to drive the cooling liquid in the first pipe to circularly flow, and further dissipate heat of the heat source. Therefore, compared with the conventional way of using the power generated by a water pump as the power for circulation, the embodiments of the present application can save power consumption and reduce the cost of the cooling system.

In addition, the source of the power for circulation of the cooling liquid in the second pipe is similar to that of the cooling liquid in the first pipe, and the sources are both coming from the power generated by the rising of the bubbles which are generated by the cooling liquid with the temperature being increased. Therefore, additional devices, such as a water pump, is not required to be provided in the second pipe, which further saves the power consumption and reduces the cost of the cooling system.

In a specific embodiment, the second heat dissipation component can form an enclosed area with a first area corresponding to the heat source and the first heat dissipation component, to enhance the ability of the second heat exchanging component in performing auxiliary heat dissipation to the enclosed area corresponding to the heat source. Specifically, the second heat dissipation component may be embodied as a radiator.

Figure 4:
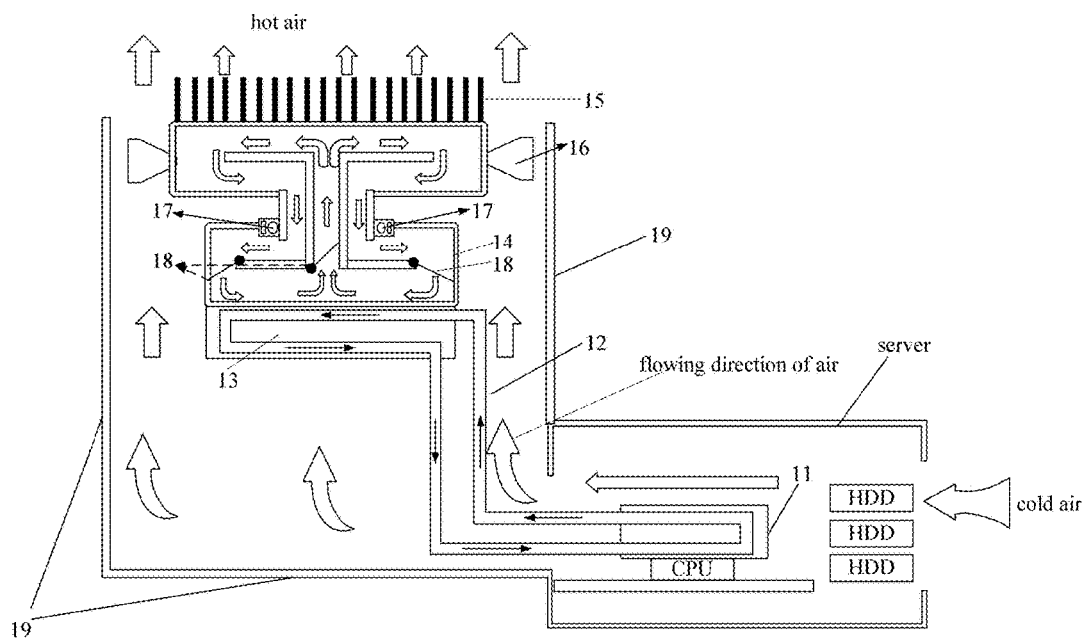
FIG. 4 is a schematic view showing the structure of an implementation of the cooling system according to embodiments of the present application when being applied in a server.

FIG. 4 is a schematic view showing the structure of an implementation of the cooling system in this embodiment of the present application when being applied in a server. As shown in FIG. 4, a bearing 17 and a check valve 18 are further provided in the second pipe 14, to control a flowing direction of the cooling liquid in the second pipe 14, thereby allowing the cooling liquid in the second pipe 14 to flow in the direction shown in FIG. 3.

In a specific embodiment, the heat source is a central processing unit (CPU) in the server. In the case that the second heat dissipation component 19, the server, and the first heat dissipation component 15 form an enclosed area, such as the enclosed area in FIG. 4, cold air enters the cooling system via an opening at a hard disk drive (HDD) of the server, and since the central processing unit and the first heat exchanging component 11 have high temperatures, the cold air is heated and then rises, thereby further forming the flowing direction of the air in FIG. 4. When the second pipe 14 is connected to the fan blade 16, flowing of the air can drive the fan blade 16 to rotate, and to further assist the cooling system in dissipating heat of the server, therefore, when the cooling system in FIG. 4 is provided with a fan, the air circulation can be used to drive the fan blade to rotate, which can effectively decrease the consumption of the electric power of the fan, and reduce the power consumption of the cooling system.

In addition, since the structure in FIG. 4 is an enclosed structure, the cooling system according to the embodiment of the present application can also effectively dissipate heat of an element having a complicated shape, such as a hard disk or a memory. Thus the cooling system according to the embodiment of the present application can effectively dissipate heat of the main heat source, such as the CPU, and other heat sources, such as the hard disk and the memory, without additionally arranging a water pump as the power for circulation of the cooling liquid.

Fourth Embodiment

A server is further provided according to an embodiment of the present application, which includes a first heat exchanging component and a first pipe. The first heat exchanging pipe is configured to connect to a heat source and obtain heat of the heat source by heat transfer, to dissipate heat of the heat source. The first pipe is configured to connect to the first heat exchanging component and a second heat exchanging component, and form a loop between the first heat exchanging component and the second heat exchanging component. The loop formed by the first pipe is configured to transfer the heat obtained by the first heat exchanging component to the second heat exchanging component. The first heat exchanging component and the second heat exchanging component have a first position relationship, to allow a cooling liquid in the first pipe to automatically flow into the second heat exchanging component after the cooling liquid exchanges heat with the first heat exchanging component, to transfer the heat generated by the heat source to the second heat exchanging component. The heat source is a central processing unit in the server.

It should be understood by those skilled in the art that, each structure of the server according to this embodiment of the present application can be understood by referring to the relevant description of the above cooling system.

Fifth Embodiment

A server is further provided according to this embodiment of the present application, which includes a first heat exchanging component and a first pipe. The first heat exchanging pipe is configured to connect to a heat source and obtain heat of the heat source by heat transfer, to dissipate heat of the heat source. The first pipe is configured to connect to the first heat exchanging component and a second heat exchanging component, and form a loop between the first heat exchanging component and the second heat exchanging component. The loop formed by the first pipe is configured to transfer the heat obtained by the first heat exchanging component to the second heat exchanging component. The first heat exchanging component and the second heat exchanging component have a first position relationship, to allow a cooling liquid in the first pipe to automatically flow into the second heat exchanging component after the cooling liquid exchanges heat with the first heat exchanging component, to transfer the heat generated by the heat source to the second heat exchanging component. The heat source is a central processing unit in the server.

In this embodiment, the first heat exchanging component and the second heat exchanging component have a first position relationship, in which the second heat exchanging component is higher than the first heat exchanging component, thus a height difference is formed between the first heat exchanging component and the second heat exchanging component.

In this embodiment, the server further includes a second pipe. A loop is formed by the second pipe to allow the cooling liquid to circulate in the loop formed by the second pipe. A first partial area of the second pipe corresponds to the second heat exchanging component, to transfer heat conducted to the second heat exchanging component to a cooling liquid corresponding to the first partial area of the second pipe.

In this embodiment, a first heat dissipation component is provided in a second partial area of the second pipe, and configured to transfer the heat transferred to the second pipe to the environment outside the cooling system.

In a specific embodiment, the first heat dissipation component is embodied as a heat dissipation component with rotatable fins.

In this embodiment, the server further includes a second heat dissipation component. The second heat dissipation component is configured to assist in dissipating heat of the environment corresponding to the heat source.

In this embodiment, the second heat dissipation component can form an enclosed area together with a first area corresponding to the heat source and the first heat dissipation component, to enhance the ability of the second heat exchanging component in performing auxiliary heat dissipation to the enclosed area corresponding to the heat source.

It should be understood by those skilled in the art that, each structure of the server according to this embodiment of the present application can be understood by referring to the relevant description of the above cooling system.

The embodiments described hereinabove are only specific implementations of the present application, and the scope of the present application is not limited to this. It is obvious for the person skilled in the art to make a few of changes and replacements based on the technical scope disclosed by the present application, and these changes and replacements are also deemed to fall into the scope of the present application. Therefore, the scope of the present application is defined by the claims.

What is claimed is:

1. A cooling system, comprising:
    a first heat exchanging component, configured to connect to a heat source and obtain heat of the heat source by heat transfer, to dissipate heat of the heat source;
    a first pipe, configured to connect to the first heat exchanging component and a second heat exchanging component, and form a loop between the first heat exchanging component and the second heat exchanging component, and to transfer the heat obtained by the first heat exchanging component to the second heat exchanging component via the loop formed by the first pipe; and
    a second pipe, wherein a loop is formed by the second pipe to allow a cooling liquid to circulate in the loop formed by the second pipe; a first partial area of the second pipe corresponds to the second heat exchanging component, to transfer heat conducted to the second heat exchanging component to the cooling liquid corresponding to the first partial area of the second pipe; and a first heat dissipation component is provided in a second partial area of the second pipe, and configured to transfer the heat transferred to the second pipe to the environment outside the cooling system;
    wherein the second heat exchanging component is higher than the first heat exchanging component, to form a height difference between the first heat exchanging component and the second heat exchanging component, to allow a cooling liquid in the first pipe to automatically flow into the second heat exchanging component after the cooling liquid exchanges heat with the first heat exchanging component, to transfer the heat generated by the heat source to the second heat exchanging component; and wherein the cooling system further comprises a second heat dissipation component; and the second heat dissipation component is configured to assist in dissipating heat of the environment corresponding to the heat source; and the second heat dissipation component forms an enclosed area with a first area corresponding to the heat source and the first heat dissipation component, to enhance the ability of the second heat exchanging component in performing auxiliary heat dissipation to the enclosed area corresponding to the heat source.

2. The cooling system according to claim 1, wherein transferring the heat transferred to the second pipe to the environment outside the cooling system via the first heat dissipation component comprises:

transferring heat transferred to the first partial area to the first heat dissipation component by circulation of the cooling liquid, to further transfer the heat to the environment outside the cooling system via the first heat dissipation component.

3. The cooling system according to claim 1, wherein the first heat dissipation component is a heat dissipation component with rotatable fins.

4. The cooling system according to claim 2, wherein the first heat dissipation component is a heat dissipation component with rotatable fins.

5. A server, comprising:

a first heat exchanging component, connected to a heat source and configured to obtain heat of the heat source by heat transfer, to dissipate heat of the heat source;

a first pipe, configured to connect to the first heat exchanging component and a second heat exchanging component, and form a loop between the first heat exchanging component and the second heat exchanging component, and to transfer the heat obtained by the first heat exchanging component to the second heat exchanging component via the loop formed by the first pipe; and a second pipe, wherein a loop is formed by the second pipe to allow a cooling liquid to circulate in the loop formed by the second pipe; a first partial area of the second pipe corresponds to the second heat exchanging component, to transfer heat conducted to the second heat exchanging component to the cooling liquid corresponding to the first partial area of the second pipe; and a first heat dissipation component is provided in a second partial area of the second pipe, and configured to transfer the heat transferred to the second pipe to the environment outside a cooling system comprising the first and second heat exchanging components and the first and second pipes;

wherein the second heat exchanging component is higher than the first heat exchanging component, to form a height difference H between the first heat exchanging component and the second heat exchanging component, to allow a cooling liquid in the first pipe to automatically flow into the second heat exchanging component after the cooling liquid exchanges heat with the first heat exchanging component, to transfer the heat generated by the heat source to the second heat exchanging component; and the heat source is a central processing unit of the server; and wherein the cooling system further comprises a second heat dissipation component; and the second heat dissipation component is configured to assist in dissipating heat of the environment corresponding to the heat source; and the second heat dissipation component is configured to form an enclosed area with a first area corresponding to the heat source and the first heat dissipation component, to enhance the ability of the second heat exchanging component in performing auxiliary heat dissipation to the enclosed area corresponding to the heat source.

\* \* \* \* \*

UNITED STATES PATENT AND TRADEMARK OFFICE
CERTIFICATE OF CORRECTION

PATENT NO. : 10,111,366 B2
APPLICATION NO. : 14/859770
DATED : October 23, 2018
INVENTOR(S) : Fan et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 345 days.

Signed and Sealed this
Sixteenth Day of July, 2019

Andrei Iancu
*Director of the United States Patent and Trademark Office*